United States Patent
Wang

(10) Patent No.: US 10,116,334 B1
(45) Date of Patent: Oct. 30, 2018

(54) REED-SOLOMON CODE ENCODER AND DECODER

(71) Applicant: Xilinx, Inc., San Jose, CA (US)

(72) Inventor: Hong Qiang Wang, Shanghai (CN)

(73) Assignee: XILINX, INC., San Jose, CA (US)

( * ) Notice: Subject to any disclaimer, the term of this patent is extended or adjusted under 35 U.S.C. 154(b) by 35 days.

(21) Appl. No.: 15/376,557

(22) Filed: Dec. 12, 2016

(51) Int. Cl.
 *H03M 13/00* (2006.01)
 *H03M 13/15* (2006.01)

(52) U.S. Cl.
 CPC ....... *H03M 13/1515* (2013.01); *H03M 13/15* (2013.01); *H03M 13/158* (2013.01); *H03M 13/6502* (2013.01); *H03M 13/6516* (2013.01); *H03M 13/151* (2013.01)

(58) Field of Classification Search
 CPC ............. H03M 13/1515; H03M 13/15; H03M 13/158; H03M 13/6516; H03M 13/151
 USPC ........................................................ 714/784
 See application file for complete search history.

(56) References Cited

U.S. PATENT DOCUMENTS

| | | | | |
|---|---|---|---|---|
| 6,353,909 B1* | 3/2002 | Amrany | ............ | H03M 13/1515 714/757 |
| 6,463,564 B1* | 10/2002 | Weng | ................. | G11B 20/1803 714/755 |
| 7,472,334 B1* | 12/2008 | Scott | ................... | H03M 13/151 714/785 |
| 7,873,894 B2* | 1/2011 | Eleftheriou | ........ | G11B 20/1426 714/756 |
| 7,877,662 B2* | 1/2011 | Eleftheriou | ........ | G11B 20/1426 714/756 |
| 8,176,397 B2* | 5/2012 | Panteleev | ......... | H03M 13/1515 714/784 |
| 8,386,901 B2* | 2/2013 | Piret | ..................... | H04L 1/1819 714/760 |
| 2006/0218470 A1* | 9/2006 | Dickson | .............. | G06F 11/1076 714/767 |
| 2016/0056920 A1* | 2/2016 | Summerson | ........ | H04W 28/065 714/776 |

OTHER PUBLICATIONS

U.S. Appl. No. 15/096,659, filed Apr. 12, 2016, Wang, Hong Qiang, San Jose, CA USA.

* cited by examiner

*Primary Examiner* — James C Kerveros
(74) *Attorney, Agent, or Firm* — David O'Brien; Craige Thompson

(57) ABSTRACT

An integrated circuit (IC) includes an encoder circuit. The encoder circuit includes an encoding input configured to receive an input message including one or more data symbols. Each data symbol has N bits and N is a positive integer. The encoder circuit includes an encoding unit configured to perform Reed-Solomon encoding to the one or more data symbols to generate one or more coding symbols. The Reed-Solomon encoding uses a Galois field having an order that is less than $2^N$. A coded message that includes the one or more data symbols and the one or more coding symbols is provided at an encoding output of the encoder circuit.

14 Claims, 8 Drawing Sheets

| 0 | 1 | 2 | 3 | 4 | 5 | 6 | 7 | 8 | 9 | 10 | 11 | 12 | 13 | 14 | 15 |
|---|---|---|---|---|---|---|---|---|---|----|----|----|----|----|----|
| 0 | 0 | 0 | 0 | 0 | 0 | 0 | 0 | 0 | 0 | 0  | 0  | 0  | 0  | 0  | 0  |
| 0 | 1 | 2 | 3 | 4 | 5 | 6 | 7 | 8 | 9 | 10 | 11 | 12 | 13 | 14 | 15 |
| 0 | 2 | 4 | 6 | 8 | 10| 12| 14| 3 | 1 | 7  | 5  | 11 | 9  | 15 | 13 |
| 0 | 3 | 6 | 5 | 12| 15| 10| 9 | 11| 8 | 13 | 14 | 7  | 4  | 1  | 2  |
| 0 | 4 | 8 | 12| 3 | 7 | 11| 15| 6 | 2 | 14 | 10 | 5  | 1  | 13 | 9  |
| 0 | 5 | 10| 15| 7 | 2 | 13| 8 | 14| 11| 4  | 1  | 9  | 12 | 3  | 6  |
| 0 | 6 | 12| 10| 11| 13| 7 | 1 | 5 | 3 | 9  | 15 | 14 | 8  | 2  | 4  |
| 0 | 7 | 14| 9 | 15| 8 | 1 | 6 | 13| 10| 3  | 4  | 2  | 5  | 12 | 11 |
| 0 | 8 | 3 | 11| 6 | 14| 5 | 13| 12| 4 | 15 | 7  | 10 | 2  | 9  | 1  |
| 0 | 9 | 1 | 8 | 2 | 11| 3 | 10| 4 | 13| 5  | 12 | 6  | 15 | 7  | 14 |
| 0 | 10| 7 | 13| 14| 4 | 9 | 3 | 15| 5 | 8  | 2  | 1  | 11 | 6  | 12 |
| 0 | 11| 5 | 14| 10| 1 | 15| 4 | 7 | 12| 2  | 9  | 13 | 6  | 8  | 3  |
| 0 | 12| 11| 7 | 5 | 9 | 14| 2 | 10| 6 | 1  | 13 | 15 | 3  | 4  | 8  |
| 0 | 13| 9 | 4 | 1 | 12| 8 | 5 | 2 | 15| 11 | 6  | 3  | 14 | 10 | 7  |
| 0 | 14| 15| 1 | 13| 3 | 2 | 12| 9 | 7 | 6  | 8  | 4  | 10 | 11 | 5  |
| 0 | 15| 13| 2 | 9 | 6 | 4 | 11| 1 | 14| 12 | 3  | 8  | 7  | 5  | 10 |

GF(16) Multiplication Lookup Table

GF(8) Multiplication Lookup Table (704)

| | 0 | 1 | 2 | 3 | 4 | 5 | 6 | 7 |
|---|---|---|---|---|---|---|---|---|
| 0 | 0 | 0 | 0 | 0 | 0 | 0 | 0 | 0 |
| 1 | 0 | 1 | 2 | 3 | 4 | 5 | 6 | 7 |
| 2 | 0 | 2 | 4 | 6 | 3 | 1 | 7 | 5 |
| 3 | 0 | 3 | 6 | 5 | 7 | 4 | 1 | 2 |
| 4 | 0 | 4 | 3 | 7 | 6 | 2 | 5 | 1 |
| 5 | 0 | 5 | 1 | 4 | 2 | 7 | 3 | 6 |
| 6 | 0 | 6 | 7 | 1 | 5 | 3 | 2 | 4 |
| 7 | 0 | 7 | 5 | 2 | 1 | 6 | 4 | 3 |

FIG. 8B

GF(8) Division Lookup Table (706)

| | 0 | 1 | 2 | 3 | 4 | 5 | 6 | 7 |
|---|---|---|---|---|---|---|---|---|
| 0 | NaN | 0 | 0 | 0 | 0 | 0 | 0 | 0 |
| 1 | NaN | 1 | 5 | 6 | 7 | 2 | 3 | 4 |
| 2 | NaN | 2 | 1 | 7 | 5 | 4 | 6 | 3 |
| 3 | NaN | 3 | 4 | 1 | 2 | 6 | 5 | 7 |
| 4 | NaN | 4 | 2 | 5 | 1 | 3 | 7 | 6 |
| 5 | NaN | 5 | 7 | 3 | 6 | 1 | 4 | 2 |
| 6 | NaN | 6 | 3 | 2 | 4 | 7 | 1 | 5 |
| 7 | NaN | 7 | 6 | 4 | 3 | 5 | 2 | 1 |

REED-SOLOMON CODE ENCODER AND DECODER

FIELD

Examples of the present disclosure generally relate to integrated circuits ("ICs") and, in particular, to an embodiment related to ICs providing Reed-Solomon code encoders and decoders.

BACKGROUND

Reed-Solomon code is a technique for adding fault tolerance to data by adding an amount of code data. Both encoding and decoding involve matrix multiplication. To encode a message, a vector representing the data to be encoded is multiplied by a distribution matrix to obtain a coded message. The coded message may pass through a data link, which may result in one or more erasures to the coded message. A decoder may receive the coded message with the one or more erasures, decode the received message by multiplying the received message by an inversion matrix that is based on the distribution matrix to obtain a decoded matrix. The complexity of matrix multiplication leads to difficulties in efficiently implementing Reed-Solomon code encoders and decoders in circuitry.

Accordingly, it would be desirable and useful to provide Reed-Solomon code encoders and decoders with improved performance and resource utilization.

SUMMARY

In some embodiments in accordance with the present disclosure, an integrated circuit (IC) includes an encoder circuit. The encoder circuit includes an encoding input configured to receive an input message including one or more data symbols, each data symbol having a data symbol width of N bits, wherein N is a positive integer. The encoder circuit further includes an encoding unit configured to perform Reed-Solomon encoding to the one or more data symbols to generate one or more coding symbols, wherein the Reed-Solomon encoding uses a Galois field having an order that is less than $2^N$. The encoder circuit further includes an encoding output configured to provide a coded message including one or more data symbols and the one or more coding symbols.

In some embodiments, the order of the Galois field is equal to $2^M$, and M is greater than two and less than N.

In some embodiments, the encoding unit includes a first Galois field arithmetic operator configured to perform multiplication and division operations on field elements of the Galois field by retrieving a pre-computed value from a storage.

In some embodiments, the storage includes a multiplication lookup table to store pre-computed values for the multiplication operations and a division lookup table to store pre-computed values for the division operations. Each of the multiplication lookup table and the division lookup table has a size equal to or less than about $M*2^{M*2}$ bits.

In some embodiments, the encoding unit includes a first sub-encoder, a second sub-encoder, and a first combining unit. The first sub-encoder is configured to receive first parts of the data symbols; and perform Reed-Solomon encoding to the first parts of the data symbols to generate first parts of the coding symbols. The second sub-encoder is configured to receive second parts of the data symbols; and perform Reed-Solomon encoding to the second parts of the data symbols to generate second parts of the coding symbols. The first combining unit is configured to generate the coding symbols by combining at least the first parts of the coding symbols and the second parts of the coding symbols. Each of the first parts and second parts of the data symbols includes at most M consecutive bits of the N bits of the data symbols.

In some embodiments, the encoding unit includes a third sub-encoder configured to receive third parts of the data symbols; and perform Reed-Solomon encoding to the third parts of the data symbols to generate third parts of the coding symbols. The first combining unit is configured to generate the coding symbols by combining at least the first parts of the coding symbols, the second parts of the coding symbols, and the third parts of the coding symbols. Each of the third parts of the data symbols includes at most M consecutive bits of the N bits of the data symbols.

In some embodiments, the IC includes a decoder circuit. The decoder circuit includes a decoding input configured to receive a received coded message including received data symbols and received coding symbols, each of the received data symbols and received coding symbols including N bits; a decoding unit configured to perform Reed-Solomon decoding based on the Galois field to the received data symbols and received coding symbols to generate decoded data symbols; and a decoding output configured to provide a decoded message including the decoded data symbols.

In some embodiments, the decoding unit includes a second Galois field arithmetic operator configured to perform multiplication and division operations on field elements of the Galois field by retrieving a pre-computed value from the storage.

In some embodiments, the decoding unit includes a first sub-decoder, a second sub-decoder, and a second combining unit. configured to receive first parts of the received data symbols and first parts of the received coding symbols; and perform Reed-Solomon decoding to the first parts of the received data symbols and the first parts of the received coding symbols to generate first parts of the decoded data symbols. The second sub-decoder is configured to receive second parts of the received data symbols and second parts of the received coding symbols; and perform Reed-Solomon decoding to the second parts of the received data symbols and the second parts of the received coding symbols to generate second parts of the decoded data symbols. The second combining unit is configured to generate the decoded data symbols by combining the first parts of the decoded data symbols and the second parts of the decoded data symbols. Each of the first parts and the second parts of the received data symbols includes at most M consecutive bits of the received data symbols. Each of the first parts and the second parts of the received coding symbols includes at most M consecutive bits of the received coding symbols.

In some embodiments, each of the first parts of the received data symbols and the first parts of the received coding symbols includes a first number of bits. Each of the second parts of the received data symbols and the second parts of the received coding symbols includes a second number of bits. The first number and the second number are different.

In some embodiments in accordance with the present disclosure, a method includes receiving an input message including one or more data symbols, each data symbol having N bits and N is a positive integer; performing Reed-Solomon encoding to the one or more data symbols to generate one or more coding symbols, wherein the Reed-Solomon encoding uses a Galois field having an order that is less than $2^N$; and providing a coded message including one or more data symbols and the one or more coding symbols.

In some embodiments, the performing the Reed-Solomon encoding based on the Galois field to the one or more data symbols includes performing multiplication and division operations on field elements of the Galois field by retrieving pre-computed multiplication values and pre-computed division values from a storage.

In some embodiments, the method includes providing, using the storage, a multiplication lookup table including the pre-computed values of the multiplication operation; and providing, using the storage, a division lookup table including the pre-computed values for the division operation. Each of the multiplication lookup table and the division lookup table has a size equal to or less than about $M*2^{M*2}$ bits.

In some embodiments, the performing Reed-Solomon encoding based on the Galois field to the one or more data symbols includes performing Reed-Solomon encoding to first parts of the data symbols to generate first parts of the coding symbols; performing Reed-Solomon encoding to second parts of the data symbols to generate second parts of the coding symbols; and generating the coding symbols by combining at least the first parts of the coding symbols and the second parts of the coding symbols. Each of the first parts and second parts of the data symbols includes at most M consecutive bits of the N bits of the data symbols.

In some embodiments, the performing Reed-Solomon encoding based on the Galois field to the one or more data symbols includes performing Reed-Solomon encoding to third parts of the data symbols to generate third parts of the coding symbols; and generating the coding symbols by combining at least the first parts of the coding symbols, the second parts of the coding symbols, and the third parts of the coding symbols. Each of the third parts of the data symbols includes at most M consecutive bits of the N bits of the data symbols.

In some embodiments, the method includes receiving a received coded message including received data symbols and received coding symbols, each of the data symbols and received coding symbols including N bits; performing Reed-Solomon decoding based on the Galois field to the received data symbols and received coding symbols to generate decoded data symbols; and providing a decoded message including the decoded data symbols.

In some embodiments, the performing Reed-Solomon decoding based on the Galois field to the received data symbols and received coding symbols includes: performing multiplication and division operations on field elements of the Galois field by retrieving the pre-computed multiplication and division results from the storage.

In some embodiments, the performing Reed-Solomon decoding based on the Galois field to the received data symbols and received coding symbols includes: performing Reed-Solomon decoding on first parts of the received data symbols and first parts of the received coding symbols to generate first parts of the decoded data symbols; perform Reed-Solomon decoding to second parts of the received data symbols and second parts of the received coding symbols to generate second parts of the decoded data symbols; and generating the decoded data symbols by combining at least the first parts of the decoded data symbols and the second parts of the decoded data symbols. Each of the first parts and the second parts of the received data symbols includes at most M consecutive bits of the received data symbols. Each of the first parts and the second parts of the received coding symbols includes at most M consecutive bits of the received coding symbols.

Other aspects and features will be evident from reading the following detailed description and accompanying drawings.

BRIEF DESCRIPTION OF THE DRAWINGS

FIG. 6 illustrates a multiplication lookup table according to some embodiments of the present disclosure.

FIG. 8A illustrates a multiplication lookup table according to some embodiments of the present disclosure.

FIG. 8B illustrates a division lookup table according to some embodiments of the present disclosure.

DETAILED DESCRIPTION

Figure 1:
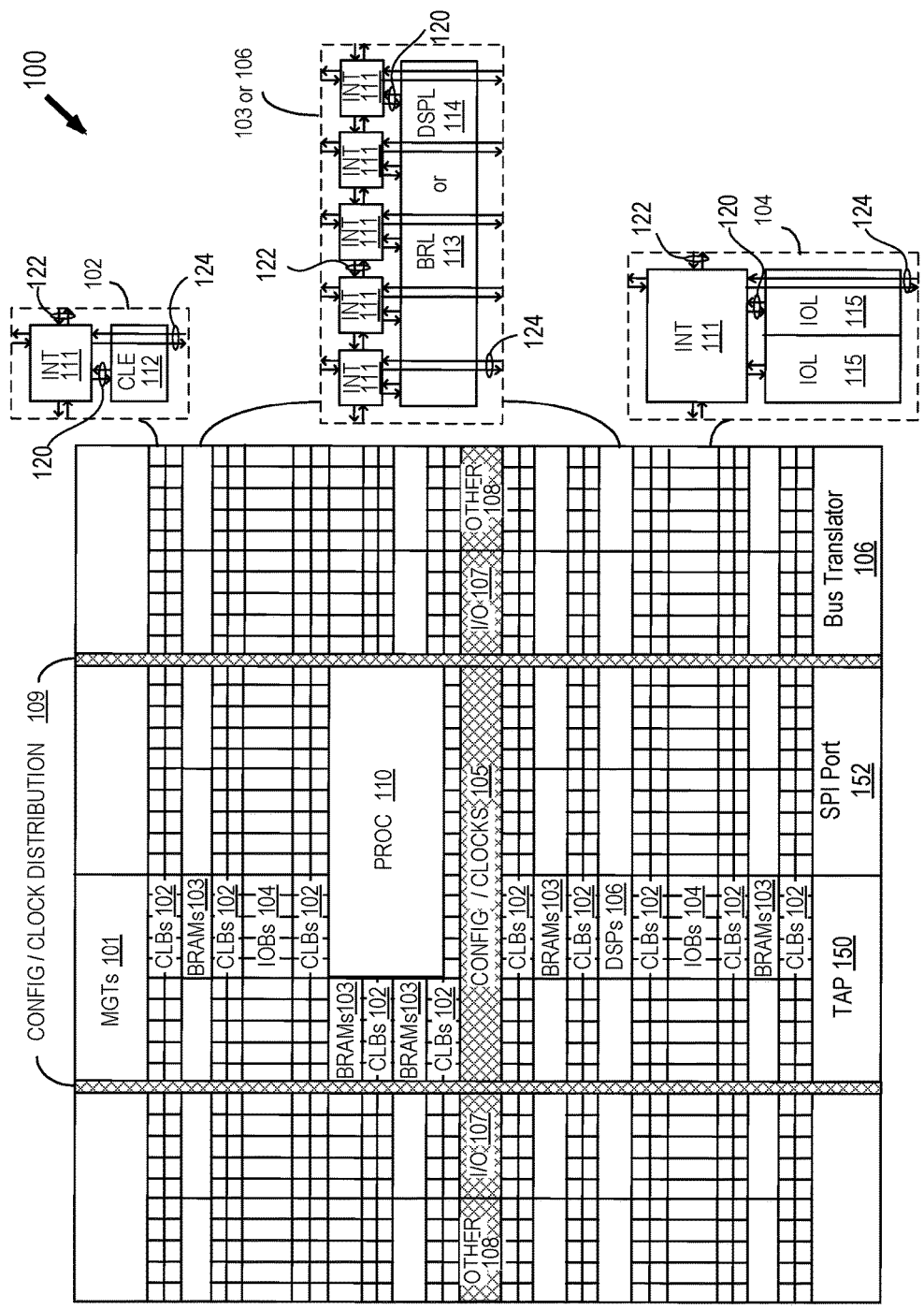
FIG. 1 is a block diagram illustrating an exemplary architecture for an IC according to some embodiments of the present disclosure.

Various embodiments are described hereinafter with reference to the figures, in which exemplary embodiments are shown. The claimed invention may, however, be embodied in different forms and should not be construed as being limited to the embodiments set forth herein. Like reference numerals refer to like elements throughout. Like elements will, thus, not be described in detail with respect to the description of each figure. It should also be noted that the figures are only intended to facilitate the description of the embodiments. They are not intended as an exhaustive description of the claimed invention or as a limitation on the scope of the claimed invention. In addition, an illustrated embodiment needs not have all the aspects or advantages shown. An aspect or an advantage described in conjunction with a particular embodiment is not necessarily limited to that embodiment and can be practiced in any other embodiments even if not so illustrated, or if not so explicitly described. The features, functions, and advantages may be achieved independently in various embodiments or may be combined in yet other embodiments.

Before describing exemplary embodiments illustratively depicted in the several figures, a general introduction is provided to further understanding. As discussed above, the complexity of matrix multiplication leads to difficulties in efficiently implementing Reed-Solomon code encoders and decoders in circuitry. Reed-Solomon code encoders and decoders may be implemented based on a Galois field (GF) of a particular order. The Galois field arithmetic operator of the Reed-Solomon code encoders and decoders may use lookup tables (e.g., GF multiplication lookup tables, GF division lookup tables) storing pre-computed values for various GF arithmetic operations to improve coding and decoding efficiency. However, such lookup tables may require a large amount of memory. For integrated circuit (IC) solutions, it has been discovered that by reducing the order of the Galois field used by the Reed-Solomon code encoders and decoders, the storage required by the lookup tables for Galois field arithmetic operations may be reduced.

With the above general understanding borne in mind, various embodiments for Reed-Solomon code are generally described below. Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

In general, each of these programmable logic devices ("PLDs"), the functionality of the device is controlled by configuration data provided to the device for that purpose. The configuration data can be stored in volatile memory (e.g., static memory cells, as common in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an exemplary FPGA architecture 100. The FPGA architecture 100 includes a large number of different programmable tiles, including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile can include at least one programmable interconnect element ("INT") 111 having connections to input and output terminals 120 of a programmable logic element within the same tile, as shown by examples included at the top of FIG. 1. Each programmable interconnect element 111 can also include connections to interconnect segments 122 of adjacent programmable interconnect element(s) in the same tile or other tile(s). Each programmable interconnect element 111 can also include connections to interconnect segments 124 of general routing resources between logic blocks (not shown). The general routing resources can include routing channels between logic blocks (not shown) comprising tracks of interconnect segments (e.g., interconnect segments 124) and switch blocks (not shown) for connecting interconnect segments. The interconnect segments of the general routing resources (e.g., interconnect segments 124) can span one or more logic blocks. The programmable interconnect elements 111 taken together with the general routing resources implement a programmable interconnect structure ("programmable interconnect") for the illustrated FPGA.

In an example implementation, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the example of FIG. 1, an area (depicted horizontally) near the center of the die (e.g., formed of regions 105, 107, and 108 shown in FIG. 1) can be used for configuration, clock, and other control logic. Column 109 (depicted vertically) extending from this horizontal area or other columns may be used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, PROC 110 spans several columns of CLBs and BRAMs. PROC 110 can include various components ranging from a single microprocessor to a complete programmable processing system of microprocessor(s), memory controllers, peripherals, and the like.

In one aspect, PROC 110 is implemented as a dedicated circuitry, e.g., as a hard-wired processor, that is fabricated as part of the die that implements the programmable circuitry of the IC. PROC 110 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100, and may be replaced with one or more of the other varieties of the programmable blocks described. Further, such blocks can be utilized to form a "soft processor" in that the various blocks of programmable circuitry can be used to form a processor that can execute program code, as is the case with PROC 110.

The phrase "programmable circuitry" can refer to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 can be considered programmable circuitry of the IC.

In some embodiments, the functionality and connectivity of programmable circuitry are not established until configuration data is loaded into the IC. A set of configuration data can be used to program programmable circuitry of an IC such as an FPGA. The configuration data is, in some cases, referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

In some embodiments, circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

FIG. 1 is intended to illustrate an exemplary architecture that can be used to implement an IC that includes programmable circuitry, e.g., a programmable fabric. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual IC, more than one adjacent row of CLBs is typically included wherever the CLBs appear, to facilitate the efficient implementation of user logic, but the number of adjacent CLB rows varies with the overall size of the IC. Moreover, the FPGA of FIG. 1 illustrates one example of a programmable IC that can employ examples of the interconnect circuits described herein. The interconnect circuits described herein can be used in other types of programmable ICs, such as complex programmable logic devices (CPLDs) or any type of programmable IC having a programmable interconnect structure for selectively coupling logic elements.

It is noted that the IC that may implement the Reed-Solomon code is not limited to the exemplary IC depicted in FIG. 1, and that IC having other configurations, or other types of IC, may also implement the Reed-Solomon code.

Figure 2:
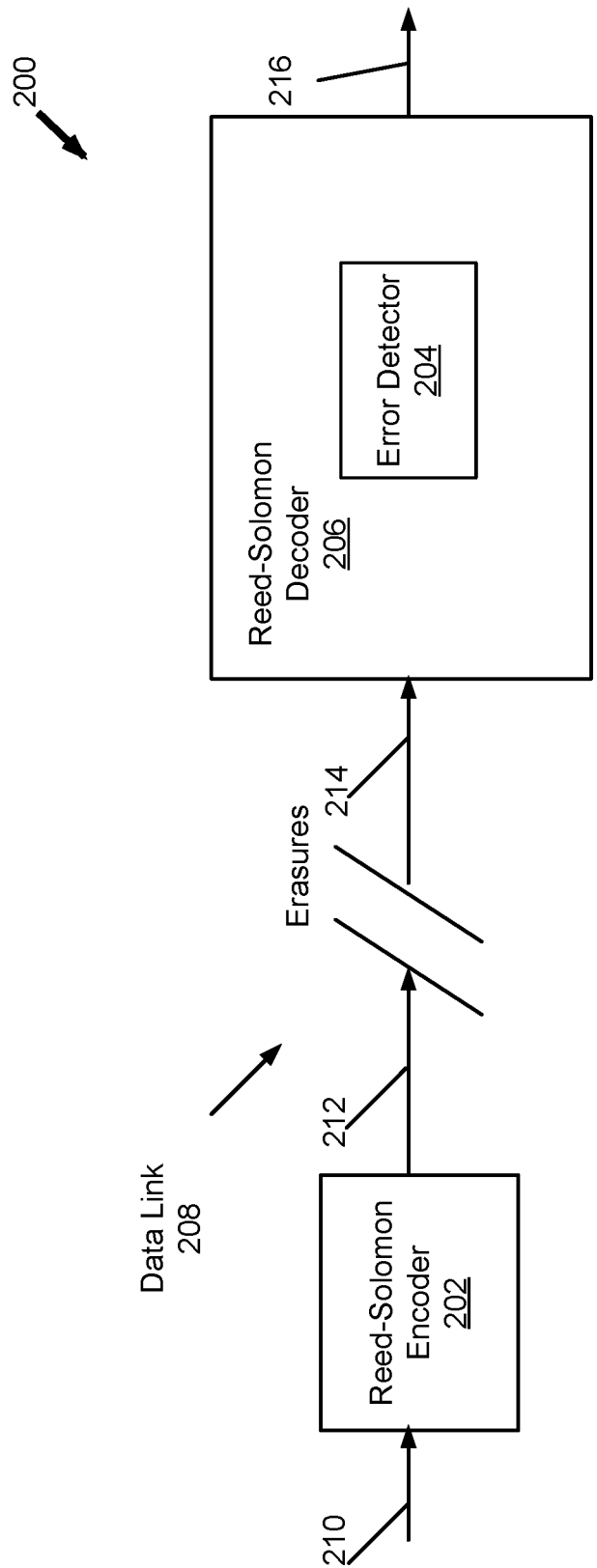
FIG. 2 is a block diagram illustrating a Reed-Solomon code system according to some embodiments of the present disclosure.

Referring to FIG. 2, illustrated therein is a Reed-Solomon code system 200 according to an embodiment. The Reed-Solomon code system 200 may include an encoder 202 and a decoder 206. The encoder 202 applies Reed-Solomon coding to an input message 210 (also referred to as original message 210). The input message 210 includes one or more symbols, where each symbol includes one or more bits. These symbols may also be referred to as data symbols. Reed-Solomon coding processes an input message 210 to add coding symbols to the input message 210 to form a coded message 212. The coding symbols add fault tolerance to the coded message 212 so that the original message 210 may be recovered despite the loss of up to a threshold number of symbols. A Reed-Solomon encoding paradigm in which m coding symbols are added to n data symbols may be referred to as RS(n, m), where n and m are positive integers. In the discussion below, an example of an RS(6, 2) with a coded message 212 having six (6) data symbols and two (2) coding symbols is used, but it should be recognized that teachings of this disclosure may be applied to encoding schemes with any numbers of data symbols and/or coding symbols.

After encoding, the coded message 212 passes through a data link 208 which may add noise to the coded message 212. A coded message 214, which may include zero or more erasures, results from passing through the data link 208. The error detector 204 in a decoder 206 identifies which symbols are erased from the coded message 212, and provides data that is not erased to the decoder 206. The decoder 206 decodes the "survived" data to generate a decoded message 216, which rebuilds the original message 210.

In various embodiments, the encoder 202 and decoder 206 and each of their blocks may be implemented using a computer system with a processor and memory configured to execute software, or as an application specific integrated circuit, that are configured to perform the operations described herein. In some embodiments, the encoder 202 and decoder 206 and each of their blocks may be implemented using a circuit within a field programmable gate array (FPGA), such as the FPGA described below with respect to FIG. 1.

Figure 3:
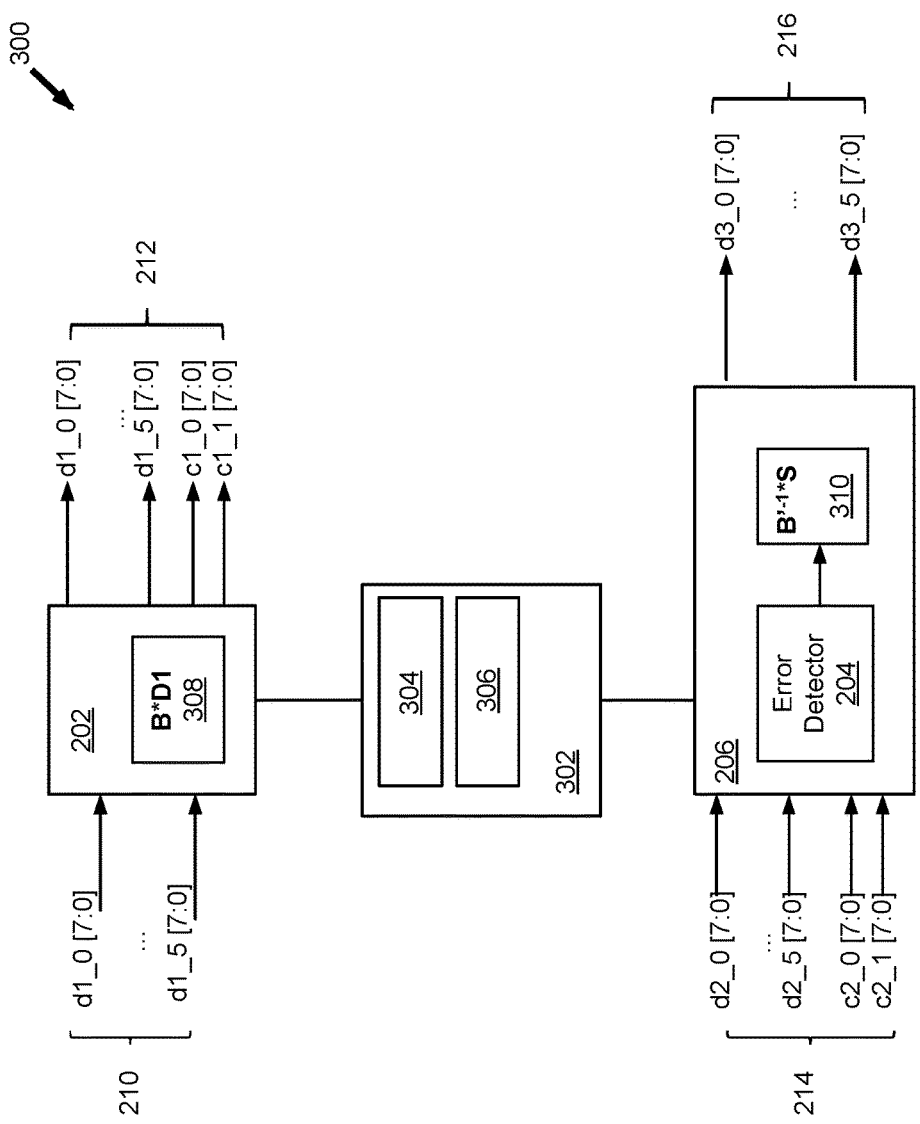
FIG. 3 is a block diagram illustrating a Reed-Solomon code system according to some embodiments of the present disclosure.

Referring to FIG. 3, illustrated is one example of Reed-Solomon code system 300 including an encoder 202, a decoder 206, and a storage 302 coupled to the encoder 202 and decoder 206.

In some embodiments, to encode an input message 210, the encoder 202 includes an encoding unit 308, which multiplies a pre-defined distribution matrix B by a vector D1, where the vector D1 includes data symbols of the input message 210. The distribution matrix B may be an n×(n+m) matrix, where n is the number of data symbols in input message 210, and m is the number of coding symbols. Multiplying the distribution matrix B by the vector D1 results in an m+n length vector that includes n data symbols and m coding symbols. This m+n length vector may be called a coded message 212.

An example distribution matrix B for encoding an input message 210 in RS(n, m), where n is 6 and m is 2 is as follows:

$$n\begin{cases} \begin{bmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ \end{bmatrix} \\ \end{cases}$$
$$m\begin{cases} \begin{bmatrix} b_{11} & b_{12} & b_{13} & b_{14} & b_{15} & b_{16} \\ b_{21} & b_{22} & b_{23} & b_{24} & b_{25} & b_{26} \\ \end{bmatrix} \end{cases}$$

In this distribution matrix B, the top n rows comprise a sub-matrix that is an identity matrix for an n element vector D1 and the bottom m rows comprise elements (e.g., elements b11, b12, b13, b14, b15, b16, b21, b22, b23, b24, and b25) that encode the m coding symbols. Multiplying this distribution matrix B by vector D1 results in a coded message 212, which is a vector of length n+m.

In the example of FIG. 3, an input message 210 including six data symbols noted as d1_0 through d1_5. The encoder 202 encodes the input message 210 to generate a coded message 212, which includes six data symbols (d1_0 through d1_5) and two coding symbols c1_0 and c1_1.

As discussed above with reference to FIG. 2, the coded message 212 may pass through a data link 208 which may add noise to the coded message 212. Noise in the data link 208 may result in erasures to the coded message 212, results in a coded message 214. The error detector 204 of the decoder 206 may detect those erasures, and generates a survive pattern. In the example of FIG. 3, a coded message 214 includes six (6) data symbols and two (2) coding symbols. The six data symbols are noted as d2_0 through d2_5, and the two coding symbols are noted as c2_0 and c2_1. In an example, the following data symbols have survived: d2_0, d2_1, d2_3, d2_4, d2_5, and the following code symbol has survived: c2_0. Thus the following symbols are considered to have been erased: d2_2 and c2_1. A survive pattern, which may be a bitmap indicating which symbols have survived, may be represented in binary or decimal values. For example, the order of bits in a binary representation of a survive pattern reflects the order of the symbols in a message. In the particular example, the order of bits of the survive pattern may correspond to the following symbols, in order: d2_0, d2_1, d2_2, d2_3, d2_4, d2_5, c2_0, c2_1. Thus, the survive pattern may be represented in binary as 11011110, wherein the erased symbols d2_2 and c2_1 having a corresponding bit value of "0" in the survive pattern, while the survived symbols d2_0, d2_1, d2_3, d2_4, d2_5, and c2_0 having a corresponding bit value of "1" in the survive pattern.

The error detector 204 may be implemented in any technically feasible manner. In one embodiment, the error detector 204 detects erasures in the coded message by checking parity bits included in each symbol. If the parity bits are in accordance with the non-parity bits of the symbol, then the error detector 204 determines that the symbol has not been erased and if the parity bits indicate an error in the symbol, then the error detector 204 determines that the symbol has been erased.

Despite these erasures, the decoder 206 may be able to recover the original message 210. If too many erasures are present in the coded message, however, then the original message 210 may not be recovered. In some examples, the number of erasures that may be recovered is equal to the number of coding symbols added to the original message 210. For example, with RS(6,2), up to two erasures may be recovered.

The error detector 204 may send the survive pattern to a decoding unit 310, which may recover the original message 210 by multiplying an inversion matrix by the non-erased symbols, also referred to as the "survival symbols." The inversion matrix is an inverse of a "reduced" matrix B' comprising rows of the distribution matrix B corresponding to the survived data. For example, symbols of the coded message 214 that have survived include symbols d2_0, d2_1, d2_3, d2_4, d2_5, and c2_0. A survived data vector S may include those survived symbols. A corresponding reduced matrix B' thus includes the first, second, fourth, fifth, sixth, and seventh row of the distribution matrix B as follows:

| 1 | 0 | 0 | 0 | 0 | 0 |
|---|---|---|---|---|---|
| 0 | 1 | 0 | 0 | 0 | 0 |
| 0 | 0 | 0 | 1 | 0 | 0 |
| 0 | 0 | 0 | 0 | 1 | 0 |
| 0 | 0 | 0 | 0 | 0 | 1 |
| $b_{11}$ | $b_{12}$ | $b_{13}$ | $b_{14}$ | $b_{15}$ | $b_{16}$ |

The inverse matrix $B'^{-1}$ is the inverse of reduced matrix B', where $B'*B'^{-1}$ results in an identity matrix I. By multiplying this inversion matrix $B'^{-1}$ and the survived data vector S, the decoding unit 310 of decoder 206 provides a decoded message 216, which recovers the original data.

In various embodiments, operations of encoding unit 308 of the encoder 202 and decoding unit 310 of the decoder 206, including for example, operations for matrix multiplication and matrix inversion, rely on certain aspects of finite field (also referred to as Galois Field (GF)) mathematics, which is the arithmetic used for Reed-Solomon coding. GF arithmetic is modular arithmetic, meaning that any operation that produces a number greater than the number of elements in the field is converted to an element in the field by performing a modulo operation of the result with a prime number that defines the field. A Galois field having q number of elements may be noted as GF(q), where q may be referred to as an order of the field. A Galois field of order q exists if and only if order q may be a prime power $p^k$, where p is a prime number and k is a positive integer. In some examples, GF($2^m$) (also referred to as binary fields) are used. In GF arithmetic, it is common to represent elements as polynomials with binary coefficients. One exemplary generator polynomial for GF($2^8$) is:

$$P(x)=x^8+x^4+x^3+x^2+1.$$

In various embodiments, operations of encoding unit 308 of the encoder 202 and the decoding unit 310 of the decoder 206 may consume a large number of processing resources.

In some examples, the encoding unit 308 uses a Galois field arithmetic operator for performing various arithmetic operations (e.g., addition, subtraction, multiplication, and division) in GF required by encoding computations (e.g., for computing B*D1) and by decoding computations (e.g., for computing $B'^{-1}$ and $B'^{-1}*S$). The Galois field arithmetic operator may use lookup tables in a storage 302 (e.g., GF multiplication lookup table 304, GF division lookup table 306) to improve encoding and decoding efficiency. For example, the Galois field arithmetic operator may perform a GF multiplication by retrieving a corresponding pre-computed product value from the GF multiplication lookup table 304. For further example, the Galois field arithmetic operator may perform a GF division by retrieving a corresponding pre-computed quotient value from the GF division lookup table 306.

In the illustrated example of FIG. 3, the encoder 202 and the decoder 206 use the same GF multiplication lookup table 304 and GF division lookup table 306 in the storage 302. However, in other examples, the encoder 202 (including its encoding unit 308) and the decoder 206 (including its decoding unit 310) may use GF multiplication and division lookup tables stored in different storages.

In some embodiments, each symbol (e.g., d1_0 through d1_5, d2_0 through d2_0, c1_0, c1_1, c2_0, c2_1, d3_0 through d3_5) includes eight bits. In an example, the eight-bit symbols may represent 256 values. Accordingly, a Galois field having an order of $2^8$ may be used in the Reed-Solomon code system 300, denoted as GF(256). Such a GF(256) includes 256 GF elements. The encoder 202 and the decoder 206 may use the same Galois field having the same generator polynomial. In the example of FIG. 3, the encoder 202 and decoder 206 use the same GF(256) having generator polynomial $P(x)=x^8+x^4+x^3+x^2+1$.

In some embodiments, the distribution matrix B may be determined based on the Galois field used in the Reed-Solomon code system. In the example of FIG. 3 where a GF(256) is used in the Reed-Solomon code system 300, an exemplary distribution matrix B is provided as follows, where each element of the exemplary distribution matrix B has a value less than 256.

$$\begin{array}{c} n \left\{ \begin{array}{|c|c|c|c|c|c|} \hline 1 & 0 & 0 & 0 & 0 & 0 \\ \hline 0 & 1 & 0 & 0 & 0 & 0 \\ \hline 0 & 0 & 1 & 0 & 0 & 0 \\ \hline 0 & 0 & 0 & 1 & 0 & 0 \\ \hline 0 & 0 & 0 & 0 & 1 & 0 \\ \hline 0 & 0 & 0 & 0 & 0 & 1 \\ \hline \end{array} \right. \\ m \left\{ \begin{array}{|c|c|c|c|c|c|} \hline 1 & 1 & 1 & 1 & 1 & 1 \\ \hline 1 & 123 & 245 & 143 & 244 & 142 \\ \hline \end{array} \right. \end{array}$$

Figure 4:
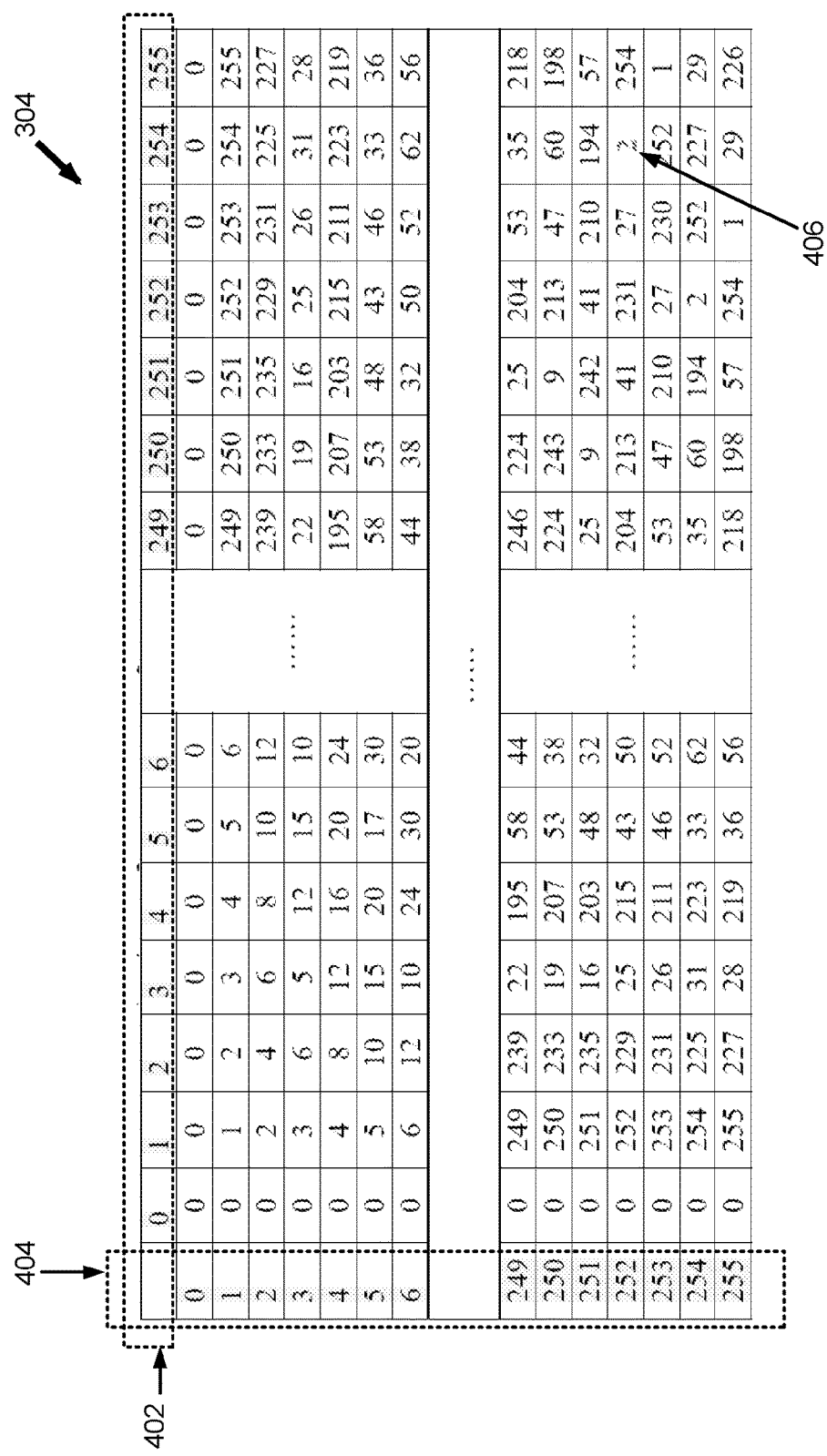
FIG. 4 illustrates a multiplication lookup table according to some embodiments of the present disclosure.

Referring to FIG. 4, illustrated is an exemplary GF multiplication lookup table 304 of GF(256) with $P(x)=x^8+x^4+x^3+x^2+1$. It is noted that the GF multiplication lookup table 304 of FIG. 4 is exemplary only, and that any generator polynomial and corresponding multiplication/division lookup table may be used. As shown in FIG. 4, row 402 corresponds to GF element multipliers, and column 404 corresponds to GF element multiplicands. As such, a GF element product of a GF element multiplier and a GF element multiplicand may be determined using the table 304. For example, in the GF(256), a product of multiplying 254 and 252 may be determined to have a value 2 as shown in a cell 406 of table 304. Similarly, a quotient of a GF element dividend divided by a GF element divisor may be determined using the GF division lookup table 306.

In some embodiments, a GF division lookup table 306 of GF(256) may have a structure substantially similar to the GF multiplication lookup table 304. In an example, the GF division lookup table 306 may have 256 rows each corresponding to a GF element divisor, 256 columns each corresponding to a GF element dividend, and 256*256 cells each corresponding to a quotient for the corresponding GF element dividend and GF element divisor. Note that since the divisor may not be 0, each cell in the first row of the lookup table 306 includes a value of not a number (NaN).

While the GF multiplication lookup table 304 and the GF division lookup table 306 may be employed to reduce the number of cycles required for multiplication/division operations of two GF elements, those lookup tables 304 and 306 may require a large amount of memory. In the examples of FIGS. 3 and 4, each of the lookup tables 304 and 306 contains $2^8*2^8$ entries, and a GF element in each entry requires 8 bits. Therefore, each of the lookup tables 304 and 306 has a size of 256*256*8 bits. In an example, each of the lookup tables 304 and 306 may require sixty-four (64) BRAM 103 of FIG. 1, where each BRAM block has a size of 18 k bits (also referred to as BRAM18 k). As such, in the Reed-Solomon code system 300, the lookup tables 304 and 306 together require that the storage 302 has a size of 256*256*8*2 bits (1024 k bits). In an example, such a storage 302 may require one hundred and twenty-eight (128) BRAM18 k.

Figure 5:
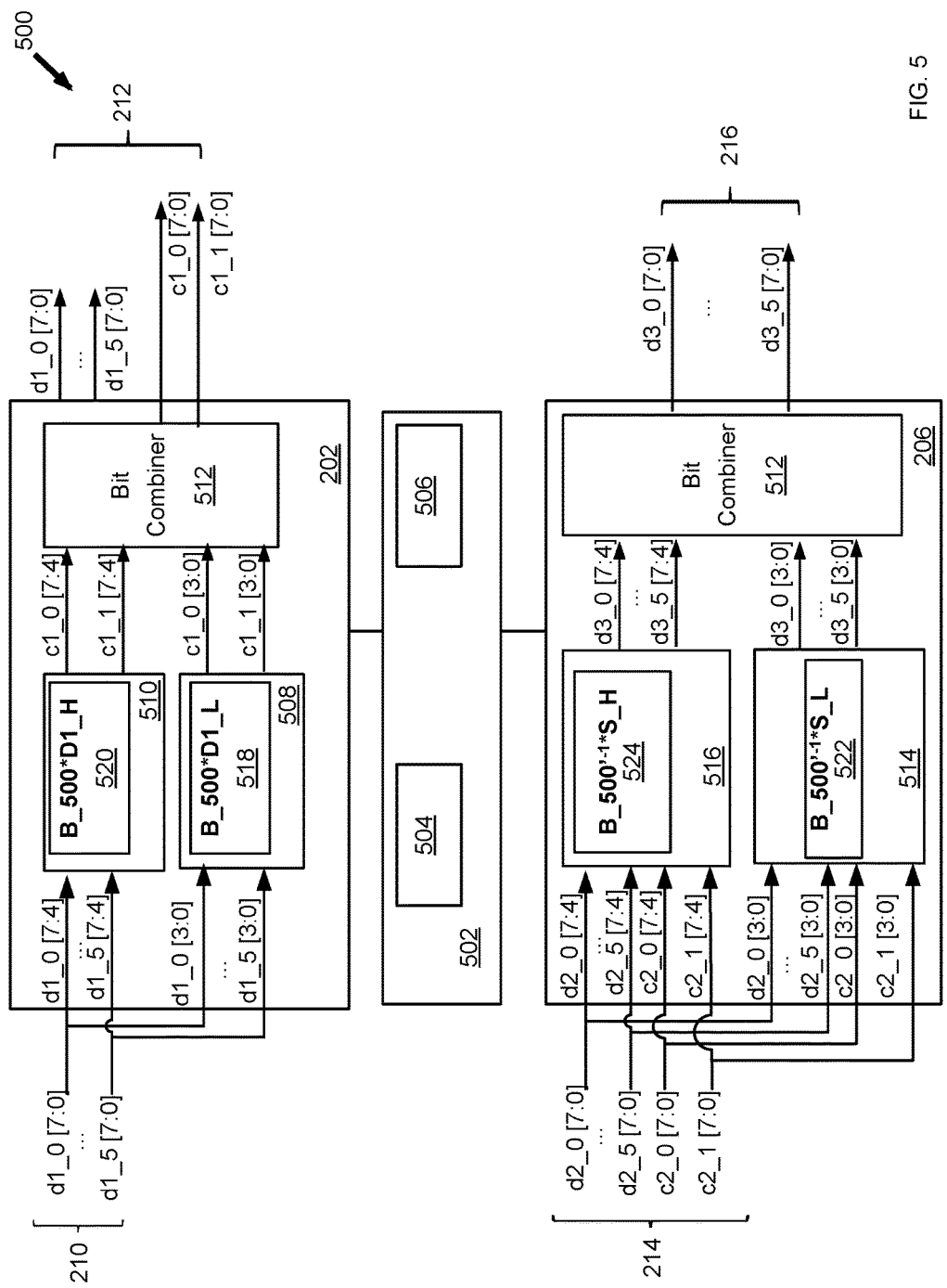
FIG. 5 is a block diagram illustrating a Reed-Solomon code system according to some embodiments of the present disclosure.
Figure 7:
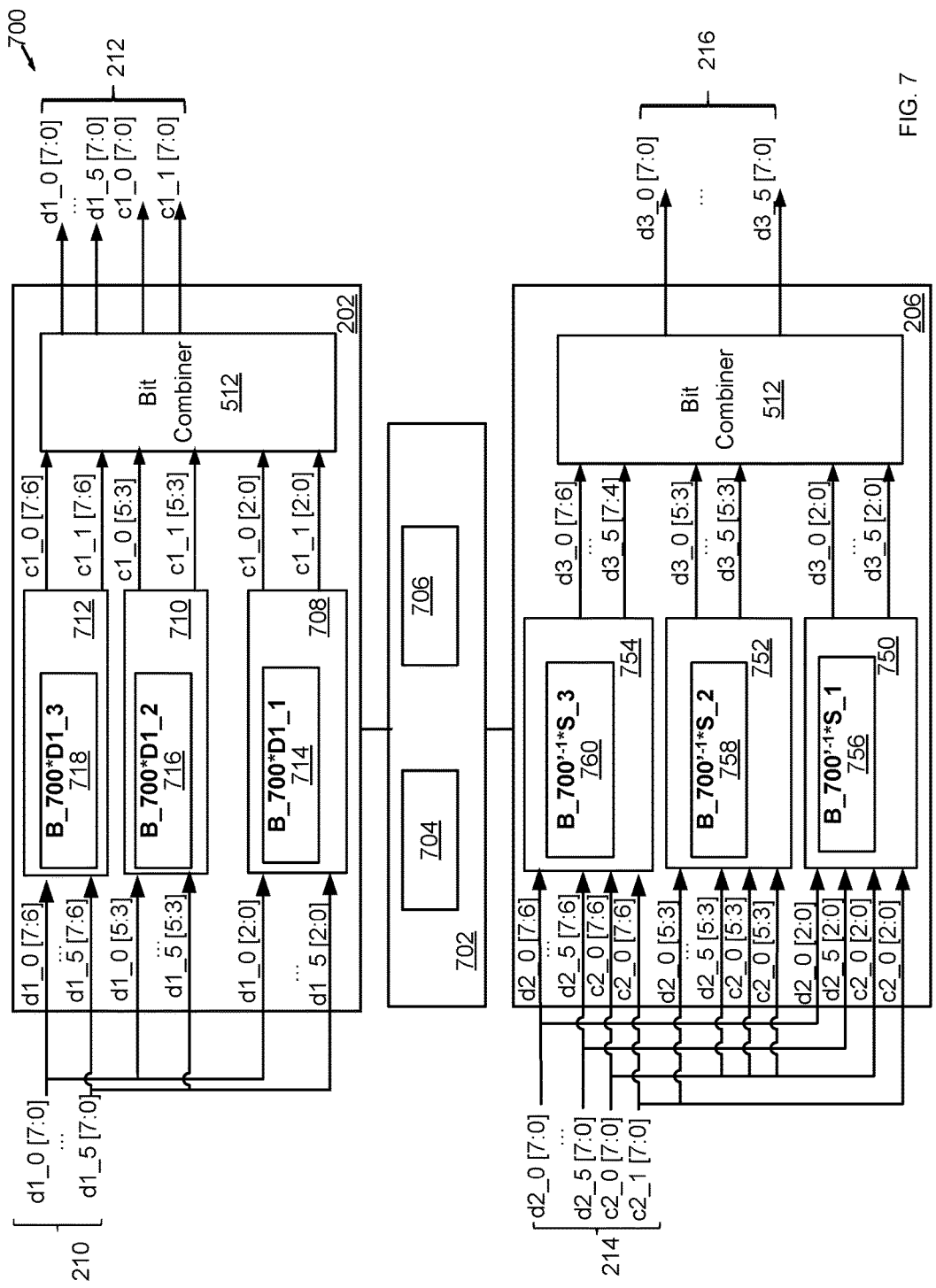
FIG. 7 is a block diagram illustrating a Reed-Solomon code system according to some embodiments of the present disclosure.

Referring to FIGS. 5, 6, 7, 8A, and 8B, various embodiments may be used to reduce the storage requirements of the GF multiplication/division lookup tables in the Reed-Solomon code system. Such reduction in the storage requirement may be achieved by reducing the order of the Galois field for the Reed-Solomon code system. As described in detail below, in Reed-Solomon code systems, bits of a symbol having a particular symbol width (e.g., eight bits) may be grouped in various ways to generate subsymbols having widths less than the symbol width. Such subsymbols may then be processed separately in the encoder and decoder of a Reed-Solomon code system, which enables the reduction of the Galois field order. FIGS. 5 and 6 illustrate a Reed-Solomon code system implemented with a Galois field GF(16) having a Galois field order of sixteen for eight-bit symbols, while FIGS. 7, 8A and 8B illustrate a Reed-Solomon code system implemented with a Galois field GF(8) having a Galois field order of eight for eight-bit symbols.

Referring to the example of FIG. 5, a Reed-Solomon code system 500 is implemented with GF(16), where each eight-bit symbol may be grouped into two four-bit subsymbols for encoding and/or decoding. In the example of FIG. 5, the Reed-Solomon code system 500 includes an encoder 202, a decoder 206, and a storage 502 coupled to the encoder 202 and decoder 206.

In the example of FIG. 5, the encoder 202 may include an encoding unit having sub-encoders 508 and 510 for processing lower parts (e.g., the lower four bits) and higher parts (e.g., the higher four bits) of the data symbols respectively. The encoding unit may also include a bit combiner 512 to combine lower parts (e.g., the lower four bits) and higher parts (e.g., the higher four bits) of the coding symbols generated by the sub-encoders 508 and 510 to provide the coding symbols.

In the example of FIG. 5, the sub-encoder 508 may process lower parts of the data symbols to generate lower parts of the coding symbols, and may be referred to as a lower part sub-encoder 508. The lower part sub-encoder 508 receives subsymbols including the lower four bits d1_0[3:0] through d1_5[3:0] of data symbols d1_0 through d1_5 respectively, and performs encoding operations to subsymbols d1_0[3:0] through d1_5[3:0] substantially similar to the encoding operations described above with reference to the encoder 202 of FIG. 3 except the differences described below. In an example, an encoding unit 518 of the lower part sub-encoder 508 may multiply a pre-defined distribution matrix B_500 by a vector D1_L, where elements of the vector D1_L include subsymbols d1_0[3:0] through d1_5 [3:0] of the data symbols d1_0 through d1_5 of the input message 210 respectively. The vector D1_L may be provided as [d1_0[3:0], d1_1 [3:0], . . . , d1_5[3:0] ]$^T$. The lower part sub-encoder 508 may generate lower parts of the coding symbols, which includes the lower four bits c1_0[3:0] and c1_1 [3:0] of coding symbols c1_0 and c1_1.

In the example of FIG. 5 where a GF(16) is used in the Reed-Solomon code system 500, an exemplary distribution matrix B_500 is provided as follows, where each element of the exemplary distribution matrix B_500 has a value less than 16.

$$n \begin{Bmatrix} \begin{pmatrix} 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ \end{pmatrix} \\ \\ \end{Bmatrix} \quad m \begin{Bmatrix} 1 & 1 & 1 & 1 & 1 & 1 \\ 1 & 6 & 15 & 8 & 14 & 9 \end{Bmatrix}$$

In some embodiments, the sub-encoder 510 may process higher parts of the data symbols to generate higher parts of the coding symbols, and may also be referred to as a higher part sub-encoder 510. The higher part sub-encoder 510 of the encoder 202 receives the higher four bits d1_0[7:4] through d1_5[7:4] of symbols d1_0 through d1_5. The higher part sub-encoder 510 may perform encoding operations to subsymbols d1_0[7:4] through d1_5[7:4] substantially similar to the encoding operations described above with reference to encoder 202 of FIG. 3 except the differences described below. In an example, an encoding unit 520 of the higher part sub-encoder 510 may multiply the pre-defined distribution matrix B_500 by a vector D1_H, where elements of the vector D1_H include subsymbols d1_0[7:4] through d1_5[7:4] of the data symbols d1_0 through d1_5 of the input message 210. The vector D1_H may be provided as [d1_0[7:4], d1_1[7:4], . . . , d1_5[7:4]]$^T$. The higher part sub-encoder 510 may generate higher parts c1_0[7:4] and c1_1[7:4] of the coding symbols c1_0 and c1_1.

In the illustrated example of FIG. 5, in the encoder 202, subsymbols c1_0[3:0] and c1_1[3:0] from the lower part sub-encoder 508 and subsymbols c1_0[7:4] and c1_1 [7:4] from the higher part sub-encoder 510 are sent to a bit combiner 512. The bit combiner 512 may combine subsymbols c1_0[3:0] and c1_0[7:4] to generate an eight-bit symbol c1_0[7:0], and combine subsymbols c1_1[3:0] and c1_1[7: 4] to generate an eight-bit symbol c1_1[7:0].

In the example of FIG. 5, the decoder 206 may include a decoding unit having sub-decoders 514 and 516 for processing lower parts (e.g., the lower four bits) and higher parts (e.g., the higher bits) of the received data symbols and the received data symbols respectively. The decoding unit may also include a bit combiner 512 to combine lower parts (e.g., the lower four bits) and higher parts (e.g., the higher four bits) of the decoded data symbols generated by the sub-decoders 514 and 516 to provide the decoded data symbols.

In some embodiments, the sub-decoder 514 may process lower parts of the received data symbols and lower parts of the received coding symbols to generate lower parts of the decoded data symbols, and may be referred to as a lower part sub-decoder 514. The lower part sub-decoder 514 receives the lower four bits d2_0[3:0] through d2_5[3:0] of received data symbols d2_0 through d2_5 and the lower four bits c2_0[3:0] and c2_1[3:0] of received coding symbols c2_0 and c2_1. The lower part sub-decoder 514 may perform decoding operations to subsymbols d2_0[3:0], . . . , d2_5 [3:0], c2_0[3:0], and c2_1[3:0] substantially similar to the decoding operations described above with reference to the decoder 206 of FIG. 3 except the differences described below. In an example, a decoding unit 522 of the lower part sub-decoder 514 may compute an inverse matrix B_500'$^{-1}$ that is the inverse of a reduced matrix B_500' corresponding to the pre-defined distribution matrix B_500. The decoding unit 522 may then multiply that inversion matrix B_500'$^{-1}$ and survived data vector S_L, where each element of the vector S_L includes a lower part (e.g., lower four bits) of the corresponding survived data symbol. The sub-decoder 514 may generate lower four bits d3_0[3:0] through d3_5[3:0] of decoded data symbols d3_0 through d3_5.

In some embodiments, the sub-decoder 516 may process higher parts of the received data symbols and higher parts of the received coding symbols to generate higher parts of the decoded data symbols, and may be referred to as a higher part sub-decoder 516. The higher part sub-decoder 516 receives the higher four bits d2_0[7:4] through d2_5[7:4] of received symbols d2_0 through d2_5 and the higher four bits c2_0[7:4] and c2_1[7:4] of received coding symbols c2_0 and c2_1. The higher part sub-decoder 516 performs decoding operations to subsymbols d2_0[7:4], . . . , d2_5[7:4], c2_0[7:4], and c2_1[7:4] substantially similar to the decoding operations described above with reference to decoder 206 of FIG. 3 except the differences described below. In an example, a decoding unit 524 of the higher part sub-decoder 516 may multiply the inversion matrix B_500'$^{-1}$ and a survived data vector S_H, where each element of the vector S_H includes a higher part (e.g., higher four bits) of the corresponding survived data symbol. The higher part sub-decoder 516 may generate the higher four bits d3_0[7:4] through d3_5[7:4] of the decoded data symbols d3_0 through d3_5. In some embodiments, a matrix inversion unit that performs an inversion to the reduced matrix B_500' to generate and/or store the inverse matrix B_500'$^{-1}$ may be coupled to the decoding units 522 and 524. In such embodiments, only one matrix inversion is performed on B_500' (e.g., by the matrix inversion unit), and the generated inverse matrix B_500'$^{-1}$ may be used by the decoding units 522 and 524.

In some embodiments, the lower four bits d3_0[3:0] through d3_5[3:0] from the lower part sub-decoder 514 and the higher four bits d3_0[7:4] through d3_5[7:4] from the higher part sub-decoder 516 are sent to a bit combiner 512. The bit combiner 512 may combine the lower bits and higher bits for a decoded data symbol to generate the eight-bit decoded data symbol. In an example, the bit combiner 512 combines d3_0[3:0] and d3_0[7:4] to generate the eight-bit decoded data symbol d3_0[7:0], combines d3_1[3:0] and d3_1[7:4] to generate the eight-bit decoded data symbol d3_1[7:0], combines d3_2[3:0] and d3_2[7:4] to generate the eight-bit decoded data symbol d3_2[7:0], combines d3_3[3:0] and d3_3[7:4] to generate the eight-bit decoded data symbol d3_3[7:0], combines d3_4[3:0] and d3_4[7:4] to generate the eight-bit decoded data symbol d3_4[7:0], and combines d3_5[3:0] and d3_5[7:4] to generate the eight-bit decoded data symbol d3_5[7:0].

In various embodiments, such separate encoding and decoding operations on subsymbols (e.g., lower parts, higher parts) of the data symbols and/or coding symbols may be achieved because in a Galois field, results of operations (e.g., multiplication, addition, subtraction, and division) on Galois field elements remain in that Galois field.

In the example of FIG. 5, the storage 502 includes a GF multiplication lookup table 504 and a GF division lookup table 506 that may be used by the sub-encoders 508 and 510 and sub-decoders 514 and 516 to improve coding and decoding efficiency. In the illustrated example, the sub-encoders 508 and 510 and sub-decoders 514 and 516 use the same GF multiplication lookup table 504 and GF division lookup table 506 in the storage 502. However, in other examples, the encoder 202 (including its sub-encoders 508 and 510) and the decoder 204 (including its sub-decoders 514 and 516) may use GF multiplication and division lookup tables in different storages. In various embodiments, the GF arithmetic operators in the encoder 202 and decoder 206 may perform GF multiplication and division operations by retrieving the pre-computed values from the GF multiplication lookup table 504 and the GF division lookup table 506. As shown in the example of FIG. 5, the sub-encoders 508 and 510 and sub-decoders 514 and 516 perform encoding/decoding to four-bit subsymbols of the eight-bit data symbols and/or coding symbols. As such, a GF($2^4$) including 16 GF elements may be used in the Reed-Solomon code system 500. The sub-encoders 508 and 510 and sub-decoders 514 and 516 may use the same Galois field having the Galois field order and the same generator polynomial. In the example of FIG. 5, the sub-encoders 508 and 510 and sub-decoders 514 and 516 use the same GF(16) having a generator polynomial $P(x)=x^4+x+1$, while any other generator polynomial may be used in the GF(16).

Referring to FIG. 6, illustrated is an exemplary GF multiplication lookup table 504 of GF(16) with a generator polynomial $P(x)=x^4+x+1$. It is noted that the GF multiplication lookup table 504 of FIG. 6 is exemplary only, and any multiplication/division lookup table corresponding to the particular Galois field of the Reed-Solomon code system 500 may be used. In the example of FIG. 6, row 602 corresponds to GF element multipliers, and column 604 corresponds to GF element multiplicands. As such, a product of a GF element multiplier and a GF element multiplicand in GF(16) may be determined using the table 504. For example, in GF(16), a product of multiplying a multiplier having a value of eleven (11) and a multiplicand having a value of nine (9) may be determined to have a value of twelve (12) as shown in the cell 606 of table 504. A GF division lookup table 506 of GF(16) may have a similar structure as the GF multiplication lookup table 504. In an example, the GF division lookup table 506 may have sixteen (16) rows each corresponding to a GF element divisor, sixteen (16) columns each corresponding to a GF element dividend, and 256 cells each corresponding to a quotient for the corresponding GF element dividend and GF element divisor. Note that since the divisor may not be 0, each cell in the first row of the lookup table 506 includes a value of NaN.

In the example of FIGS. 5 and 6, each of the GF multiplication lookup table 504 and the GF division lookup table 506 for the GF(16) contains 256 cells, while a GF element in each cell requires four bits. Therefore, each of the lookup tables 504 and 506 has a size of 16*16*4 bits (1024 bits). In an example, each of the lookup tables 504 and 506 may require one BRAM18 k. As such, in the Reed-Solomon code system 500, the lookup tables 504 and 506 together require that the storage 502 has a size of 16*16*4*2 bits (2 k bits). In an example, such a storage 502 may require two BRAM18 k. Comparing the Reed-Solomon code system 500 of FIG. 5 to the Reed-Solomon code system 300 of FIG. 3, by reducing the order of the Galois field in the Reed-Solomon code system from 256 to 16, the storage required by the GF multiplication lookup table and the GF division table is reduced significantly (e.g., from 1024 k bits to 2 k bits).

Referring to FIGS. 7, 8A, and 8B, in some embodiments, reduction in the storage requirements of the GF multiplication/division lookup tables in the Reed-Solomon code system may be achieved by using GF(8) in a Reed-Solomon code system for eight-bit symbols. In such embodiments, each eight-bit symbol may be divided into more than two subsymbols (e.g., three subsymbols), while each subsymbol may be processed separately from the other subsymbols of the symbol.

Referring to the example of FIG. 7, a Reed-Solomon code system 500 is implemented with GF($2^3$) by processing three parts (subsymbols) of each data symbol and/or coding symbol separately in the encoder 202 and decoder 206. In the example of FIG. 7, the Reed-Solomon code system 700 includes an encoder 202, a decoder 206, and a storage 702 coupled to the encoder 202 and decoder 206.

In the example of FIG. 7, the encoder 202 may include an encoding unit having sub-encoders 708, 710, and 712 for processing first parts (e.g., the lower three bits), second parts (e.g., the middle three bits), and third parts (e.g., the higher two bits) of the data symbols respectively. The encoding unit may also include a bit combiner 512 to combine first parts (e.g., the lower three bits), second parts (e.g., the middle three bits), and third parts (e.g., the higher two bits) of the coding symbols generated by the sub-encoders 708, 710, and 712 to provide the coding symbols.

In the example of FIG. 7, the sub-encoder 708 may process first parts of the data symbols to generate first parts of the coding symbols, and may be referred to as a first part sub-encoder 708. The first part sub-encoder 708 receives the lower three bits d1_0[2:0] through d1_5[2:0] of data symbols d1_0 through d1_5, and performs encoding operations to subsymbols d1_0[2:0] through d1_5[2:0] substantially similar to the encoding operations described above with reference to the encoder 202 of FIG. 3 except the differences described below. In an example, an encoding unit 714 of the first part sub-encoder 708 may multiply a pre-defined distribution matrix B_700 by a vector D1_1. Elements of the vector D1_1 may include subsymbols of the data symbols including lower three bits d1_0[2:0] through d1_5[2:0] of the data symbols d1_0 through d1_5 of the input message 210 respectively. The vector D1_1 may be provided as [d1_0[2:0], ... m d1_1 [2:0], ..., d1_5[2:0]]$^T$. The first part sub-encoder 708 may generate first parts of the coding symbols, which includes the lower three bits c1_0[2:0] and c1_1 [2:0] of coding symbols c1_0 and c1_1.

In the example of FIG. 5 where a GF(8) is used in the Reed-Solomon code system 500, an exemplary distribution matrix B_700 is provided as follows, where each element of the exemplary distribution matrix B_700 has a value less than 8.

$$n\left\{\begin{array}{|cccccc|}\hline 1 & 0 & 0 & 0 & 0 & 0 \\ 0 & 1 & 0 & 0 & 0 & 0 \\ 0 & 0 & 1 & 0 & 0 & 0 \\ 0 & 0 & 0 & 1 & 0 & 0 \\ 0 & 0 & 0 & 0 & 1 & 0 \\ 0 & 0 & 0 & 0 & 0 & 1 \\ \hline \end{array}\right.$$
$$m\left\{\begin{array}{|cccccc|}\hline 1 & 1 & 1 & 1 & 1 & 1 \\ 1 & 2 & 7 & 4 & 6 & 5 \\ \hline \end{array}\right.$$

In the example of FIG. 7, the sub-encoder 710 may process second parts of the data symbols to generate second parts of the coding symbols, and may be referred to as a second part sub-encoder 710. The second part sub-encoder 710 receives the middle three bits d1_0[5:3] through d1_5[5:3] of data symbols d1_0 through d1_5, and performs encoding operations to subsymbols d1_0[5:3] through d1_5[5:3] substantially similar to the encoding operations described above with reference to the encoder 202 of FIG. 3 except the differences described below. In an example, an encoding unit 716 of the second part sub-encoder 710 may multiply a pre-defined distribution matrix B_700 by a vector D1_2. Elements of the vector D1_2 may include subsymbols of the data symbols including middle three bits d1_0[5:3] through d1_5[5:3] of the data symbols d1_0 through d1_5 of the input message 210 respectively. The vector D1_2 may be provided as [d1_0[5:3], d1_1[5:3], ..., d1_5[5:3]]$^T$. The second part sub-encoder 710 may generate second parts of the coding symbols, which includes the middle three bits c1_0[5:3] and c1_1 [5:3] of coding symbols c1_0 and c1_1.

In the example of FIG. 7, the sub-encoder 712 may process third parts of the data symbols to generate third parts of the coding symbols, and may be referred to as a third part sub-encoder 712. The third part sub-encoder 712 receives the higher two bits d1_0[7:6] through d1_5[7:6] of data symbols d1_0 through d1_5, and performs encoding operations to subsymbols d1_0[7:6] through d1_5[7:6] substantially similar to the encoding operations described above with reference to the encoder 202 of FIG. 3 except the differences described below. In an example, an encoding unit of the third part sub-encoder 712 may multiply a pre-defined distribution matrix B_700 by a vector D1_3. Elements of the vector D1_3 include subsymbols of the data symbols including higher two bits d1_0[7:6] through d1_5[7:6] of the data symbols d1_0 through d1_5 of the input message 210 respectively. The vector D1_3 may be provided as [d1_0[7:6], d1_1[7:6], ..., d1_5[7:6]]$^T$. The third part sub-encoder 712 may generate third parts of the coding symbols, which includes the higher two bits c1_0[7:6] and c1_1 [7:6] of coding symbols c1_0 and c1_1.

In the illustrated example of FIG. 7, in the encoder 202, the first parts, second parts, and third parts of the coding symbols generated by the sub-encoder 708, 710, and 712 respectively are sent to a bit combiner 512. The bit combiner 512 combines c1_0[2:0], c1_0[5:3], and c1_0[7:6] to generate an eight-bit symbol c1_0[7:0], and combines c1_1[2:0], c1_1[5:3], and c1_1 [7:6] to generate an eight-bit symbol c1_1 [7:0]

In the example of FIG. 7, the decoder 206 may include a decoding unit having sub-decoders 750, 752, and 754 for processing first parts (e.g., the lower three bits), second parts (e.g., the middle two bits), and third parts (e.g., the higher two bits) of the received data symbols and the received data symbols respectively. The decoding unit may also include a bit combiner 512 to combine first parts (e.g., the lower three bits), second parts (e.g., the middle two bits), and third parts (e.g., the higher two bits) of the decoded data symbols generated by the sub-decoders 750, 752, and 754 to provide the decoded data symbols.

In some embodiments, the sub-decoder 750 may process first parts of the received data symbols and first parts of the received coding symbols to generate first parts of the decoded data symbols, and may be referred to as a first part sub-decoder 750. The first part sub-decoder 750 receives the lower three bits d2_0[2:0] through d2_5[2:0] of received data symbols d2_0 through d2_5 and lower three bits c2_0[2:0] and c2_1[2:0] of received coding symbols c2_0 and c2_1. The first part sub-decoder 750 may perform decoding operations to subsymbols d2_0[2:0], ..., d2_5[2:0], c2_0[2:0], and c2_1 [2:0] substantially similar to the decoding operations described above with reference to the decoder 206 of FIG. 3 except the differences described below. In an example, a decoding unit 756 of the first part sub-decoder 750 may compute an inverse matrix B_700'$^{-1}$ that is the inverse of the reduced matrix B_700', and multiply that inversion matrix B_700'$^{-1}$ and survived data vector S_1. Each element of the vector S_1 may include the first part (e.g., lower three bits) of the corresponding survived data symbol. The first part sub-decoder 750 may generate first parts of the decoded data symbols, which include the lower three bits d3_0[2:0] through d3_5[2:0] of decoded data symbols d3_0 through d3_5.

In some embodiments, the sub-decoder 752 may process second parts of the received data symbols and second parts of the received coding symbols to generate first parts of the decoded data symbols, and may be referred to as a second part sub-decoder 752. The second part sub-decoder 752 receives the middle three bits d2_0[5:3] through d2_5[5:3] of received data symbols d2_0 through d2_5 and middle three bits c2_0[5:3] and c2_1[5:3] of received coding symbols c2_0 and c2_1. The second part sub-decoder 752 may perform decoding operations to subsymbols d2_0[5:3] through d2_5[5:3], c2_0[5:3], and c2_1[5:3] substantially similar to the decoding operations described above with reference to the decoder 206 of FIG. 3 except the differences described below. In an example, a decoding unit 758 of the second part sub-decoder 752 may compute an inverse matrix B_700'$^{-1}$ that is the inverse of the reduced matrix B_700'. The decoding unit 758 may then multiply that matrix B_700'$^{-1}$ and survived data vector S_2, where elements of the vector S_2 include second parts (e.g., middle three bits) of the corresponding survived data symbols. The second part sub-decoder 752 may generate second parts of the decoded data symbols, which include the middle three bits d3_0[5:3] through d3_5[5:3] of decoded data symbols d3_0 through d3_5.

In some embodiments, the sub-decoder 754 may process third parts of the received data symbols and third parts of the received coding symbols to generate first parts of the decoded data symbols, and may be referred to as a third part sub-decoder 754. The third part sub-decoder 754 receives the higher two bits d2_0[7:6] through d2_5[7:6] of received data symbols d2_0 through d2_5 and higher two bits c2_0[7:6] and c2_1[7:6] of received coding symbols c2_0 and c2_1. The third part sub-decoder 754 may perform decoding operations to subsymbols d2_0[7:6], ..., d2_5[7:6], c2_0[7:6], and c2_1 [7:6] substantially similar to the decoding operations described above with reference to the decoder 206 of FIG. 3 except the differences described below. In an example, a decoding unit 760 of the first part sub-decoder 750 may compute an inverse matrix B_700'$^{-1}$ that is the inverse of the reduced matrix B_700'. The decoding unit 760 may then multiply that inversion matrix B_700'$^{-1}$ and survived data vector S_3, where elements of the vector S_3 include third parts (e.g., higher two bits) of the survived data symbols. The third part sub-decoder 754 may generate third parts of the decoded data symbols, which include the higher two bits d3_0[7:6] through d3_5[7:6] of decoded data symbols d3_0 through d3_5. In some embodiments, a matrix inversion unit that performs an inversion to the reduced matrix B_700' to generate and/or store the inverse matrix B_700'$^{-1}$ may be coupled to the decoding units 756, 758, and 760. In such embodiments, only one matrix inversion is performed on B_700' (e.g., by the matrix inversion unit), and the generated inverse matrix B_700'$^{-1}$ may be used by the decoding units 756, 758, and 760.

In some embodiments, the first parts, second parts, and third parts of the decoded data symbols are sent to a bit combiner 512 of the decoder 206 of the Reed-Solomon code system 700. The bit combiner 512 combines the first parts, second parts, and third parts of a decoded data symbol to generate the eight-bit decoded data symbol. For example, the bit combiner 512 combines subsymbols d3_0[2:0], d3_0[5:3], and d3_0[7:6] to generate the eight-bit decoded data symbol d3_0, combines subsymbols d3_1[2:0], d3_1 [5:3], and d3_1 [7:6] to generate the eight-bit decoded data symbol d3_1, and combines subsymbols d3_2[2:0], d3_2[5:3], and d3_2[7:6] to generate the eight-bit decoded data symbol d3_2. For further example, the bit combiner 512 combines subsymbols d3_3[2:0], d3_3[5:3], and d3_3[7:6] to generate the eight-bit decoded data symbol d3_3, combines subsymbols d3_4[2:0], d3_4[5:3], and d3_4[7:6] to generate the eight-bit decoded data symbol d3_4, and combines subsymbols d3_5[2:0], d3_5[5:3], and d3_5[7:6] to generate the eight-bit decoded data symbol d3_5.

In the example of FIG. 7, the storage 702 includes a GF multiplication lookup table 704 and a GF division lookup table 706 that may be used by the sub-encoders 708, 710, and 712 and sub-decoders 750, 752, and 754 to improve coding and decoding efficiency. In the illustrated example the sub-encoders 708, 710, and 712 and sub-decoders 750, 752, and 754 use the same GF multiplication lookup table 704 and GF division lookup table 706. However, in other examples, the encoder 202 (including the sub-encoders 708, 710, and 712) and the decoder 204 (including the sub-decoders 750, 752, and 754) may use GF multiplication lookup table and GF division lookup table in different storages. In various embodiments, the GF arithmetic operators in the encoder 202 and decoder 206 may perform GF multiplication and GF division by retrieving the pre-computed values from the GF multiplication lookup table 704 and the GF division lookup table 706. As shown in the example of FIG. 7, the sub-encoders 708, 710, and 712 and sub-decoders 750, 752, and 754 perform encoding/decoding to subsymbols having a width equal to or less than three bits. As such, a GF(2$^3$) including eight GF elements may be used in the Reed-Solomon code system 700. The sub-encoders 708, 710, and 712 and sub-decoders 750, 752, and 754 may use the same Galois field having the same generator polynomial. In the example of FIG. 5, the sub-encoders 708, 710, and 712 and sub-decoders 750, 752, and 754 use the same GF(8) having a generator polynomial P(x)=x$^3$+x+1.

Referring to FIG. 8A, illustrated is an exemplary GF multiplication lookup table 704 of GF(2$^3$) with a generator polynomial P(x)=x$^3$+x+1. As shown in FIG. 8A, row 802 corresponds to GF element multipliers, and column 804 corresponds to GF element multiplicands. As such, a product of a GF element multiplier and a GF element multiplicand may be determined using the table 704. For example, in GF(2$^3$), a product of multiplying 6 and 7 may be determined to have a value 4 as shown in the cell 806 of the lookup table 704.

Referring to FIG. 8B, illustrated is an exemplary GF division lookup table 706 of GF(2$^3$) with a generator polynomial P(x)=x$^3$+x+1. As shown in FIG. 8B, row 852 corresponds to GF element dividends, and column 854 corresponds to GF element divisors. Note that since the divisor can't be 0, each cell in the first row of the lookup table 706 includes a value of NaN. As such, a quotient of a GF element dividend divided by a GF element divisor may be determined using the table 706. For example, in GF(2$^3$), dividing 3 by 5 may be determined to have a value 6 as shown in the cell 856 of the lookup table 706.

It is noted that the GF multiplication lookup table 704 of FIG. 8A and the GF division lookup table 706 of FIG. 8B are exemplary only, and that any generator polynomial and corresponding multiplication/division lookup table may be used in the GF(2$^3$) of the Reed-Solomon code system 700.

In the example of FIGS. 7, 8A, and 8B, each of the GF multiplication lookup table 704 and the GF division lookup table 706 for the GF(8) contain eight by eight (sixty-four) elements, while each element is three-bit wide. As such, lookup tables 704 and 706 require that the storage 702 having a size of 8*8*3*2 bits (384 bits). Comparing the Reed-Solomon code system 700 of FIG. 7 to the Reed-Solomon code system 300 of FIG. 3, by reducing the order of the Galois field in the Reed-Solomon code system from 256 to 8, the storage required by the GF multiplication lookup table and the GF division table is reduced significantly (e.g., from 1024 k bits to 384 bits).

It is noted that various configurations (e.g., the configuration of the Reed-Solomon code, the symbol width, the Galois field order, the generator polynomial of the Galois field, widths of the subsymbols for the sub-encoders and sub-decoders) illustrated in FIGS. 2-8B are exemplary only and not intended to be limiting beyond what is specifically recited in the claims that follow. It will be understood by those skilled in that art that other configurations may be used. For example, while an example of an RS(6, 2) with a coded message having six data symbols and two coding symbols is used, teachings of this disclosure may be applied to Reed-Solomon schemes with any numbers of data symbols and/or coding symbols. For further example, where a reduction in the Galois field order for eight-bit symbols are described, teachings of this disclosure may be applied to reduce the Galois field order for symbols of any width (e.g., 4-bit symbols, 16-bit symbols, 32-bit symbols).

In various Reed-Solomon code systems, the bits of each symbol may be grouped in different ways to provide subsymbols to the sub-encoders and sub-decoders of the Reed-Solomon code system to achieve a reduced Galois field order. In an example, to achieve a Galois field order of 2$^M$, each subsymbol may have a width that is equal to or less than M bits. For example, to achieve a Galois field order of 2$^3$ in the Reed-Solomon system 700 of FIG. 7, bits of each symbol may be grouped in different ways to provide subsymbols to the sub-encoders 708, 710, and 712 and sub-decoders 750, 752, and 754, while each subsymbol may have a width that is equal to or less than three. In an example, the sub-encoders 708, 710, and 712 may receive two-bit subsymbols (e.g., d1_0[1:0], d1_1[1:0], . . . , d1_5 [1:0]), three-bit subsymbols (e.g., d1_0[4:2], d1_1[4:2], . . . , d1_5[4:2]), and three-bit subsymbols (e.g., d1_0[7:5], d1_1[7:5], . . . , d1_5[7:5]) respectively. In another example, the sub-encoders 708, 710, and 712 may receive three-bit subsymbols (e.g., d1_0[2:0], d1_1 [2:0], . . . , d1_5[2:0]), two-bit subsymbols (e.g., d1_0[4:3], d1_1 [4:3], . . . , d1_5[4:3]), and three-bit subsymbols (e.g., d1_0[7:5], d1_1 [7:5], . . . , d1_5[7:5]) respectively. In yet another example, the sub-decoders 750, 752, and 754 may receive two-bit subsymbols (e.g., d2_0 [1:0], d2_1[1:0], . . . , d2_5[1:0], c2_0[1:0], c2_1 [1:0]), three-bit subsymbols (e.g., d2_0[4:2], d2_1[4:2], . . . , d2_5[4:2], c2_0[4:2], c2_1[4:2]), and three-bit subsymbols (e.g., d2_0[7:5], d2_1[7:5], . . . , d1_5[7:5], c2_0[7:5], c2_1[7:5]) respectively. In another example, the sub-encoders 708, 710, and 712 may receive three-bit subsymbols (e.g., d2_0[2:0], d2_1[2:0], . . . , d2_5[2:0], c2_0[2:0], c2_1[2:0]), two-bit subsymbols (e.g., d2_0[4:3], d1_2[4:3], . . . , d2_5[4:3], c2_0[4:3], c2_1[4:3])), and three-bit subsymbols (e.g., d1_0[7:5], d1_1[7:5], . . . , d1_5[7:5], c2_0[7:5], c2_1[7:5]) respectively.

Various advantages may be present in various applications of the present disclosure. No particular advantage is required for all embodiments, and different embodiments may offer different advantages. One of the advantages of some embodiments is that by reducing the Galois field order, the storage size required by GF multiplication and division lookup tables used by GF multiplication and division operations is reduced significantly. Another advantage of some embodiments is that by reducing the size of the GF multiplication and division lookup tables, the speed of the GF multiplication and division operations may be improved, which improves the encoding/decoding performance. Yet another advantage is that for symbols having a particular width, Reed-Solomon code systems using different reduced Galois field orders may be available, which provides design flexibility. For example, for eight-bit symbols, either a Reed-Solomon code system using a Galois field having an order of sixteen or a Reed-Solomon code system using a Galois field having an order of eight may be used based on design requirements.

Although particular embodiments have been shown and described, it will be understood that it is not intended to limit the claimed inventions to the preferred embodiments, and it will be obvious to those skilled in the art that various changes and modifications may be made without department from the spirit and scope of the claimed inventions. The specification and drawings are, accordingly, to be regarded in an illustrative rather than restrictive sense. The claimed inventions are intended to cover alternatives, modifications, and equivalents.

What is claimed is:

1. An integrated circuit (IC), comprising:
  an encoder circuit includes:
    an encoding input configured to receive an input message including one or more data symbols, each data symbol having a data symbol width of N bits, wherein N is a positive integer;
    an encoding unit configured to perform Reed-Solomon encoding to the one or more data symbols to generate one or more coding symbols, wherein the Reed-Solomon encoding uses a Galois field having an order that is less than $2^N$, the encoding unit comprising a first Galois field arithmetic operator configured to perform multiplication operations and division operations on field elements of the Galois field by retrieving pre-computed values from a storage; and
    an encoding output configured to provide a coded message including the one or more data symbols and the one or more coding symbols,
  wherein the order of the Galois field is equal to $2^M$, wherein M is greater than two and less than N,
  wherein the storage comprises:
    a multiplication lookup table to store pre-computed values for the multiplication operations; and
    a division lookup table to store pre-computed values for the division operations;
  wherein each of the multiplication lookup table and the division lookup table has a size of less than $M*2^{M*2}$ bits.

2. The integrated circuit of claim 1, wherein the encoding unit includes:
  a first sub-encoder configured to:
    receive first parts of the data symbols; and
    perform Reed-Solomon encoding to the first parts of the data symbols to generate first parts of the coding symbols;
  a second sub-encoder configured to:
    receive second parts of the data symbols; and
    perform Reed-Solomon encoding to the second parts of the data symbols to generate second parts of the coding symbols;
  a first combining unit configured to generate the coding symbols by combining at least the first parts of the coding symbols and the second parts of the coding symbols;
  wherein each of the first parts and second parts of the data symbols includes at most M consecutive bits of the data symbols.

3. The integrated circuit of claim 2, wherein the encoding unit includes:
  a third sub-encoder configured to:
    receive third parts of the data symbols; and
    perform Reed-Solomon encoding to the third parts of the data symbols to generate third parts of the coding symbols; and
  wherein the first combining unit is configured to generate the coding symbols by combining at least the first parts of the coding symbols, the second parts of the coding symbols, and the third parts of the coding symbols; and
  wherein each of the third parts of the data symbols includes at most M consecutive bits of the data symbols.

4. The integrated circuit of claim 1, further comprising:
  a decoder circuit includes:
    a decoding input configured to receive a received coded message including received data symbols and received coding symbols, each of the received data symbols and received coding symbol having N bits;
    a decoding unit configured to perform Reed-Solomon decoding based on the Galois field to the received data symbols and received coding symbols to generate decoded data symbols; and
    a decoding output configured to provide a decoded message including the decoded data symbols.

5. The integrated circuit of claim 4, wherein the decoding unit includes:
  a second Galois field arithmetic operator configured to perform multiplication operations and division operations on field elements of the Galois field by retrieving pre-computed values from the storage.

6. The integrated circuit of claim 5, wherein the decoding unit includes:
  a first sub-decoder configured to:
    receive first parts of the received data symbols and first parts of the received coding symbols; and perform Reed-Solomon decoding to the first parts of the received data symbols and the first parts of the received coding symbols to generate first parts of the decoded data symbols;

a second sub-decoder configured to:
  receive second parts of the received data symbols and second parts of the received coding symbols; and
  perform Reed-Solomon decoding to the second parts of the received data symbols and the second parts of the received coding symbols to generate second parts of the decoded data symbols;

a second combining unit configured to generate the decoded data symbols by combining the first parts of the decoded data symbols and the second parts of the decoded data symbols;

wherein each of the first parts and the second parts of the received data symbols includes at most M consecutive bits of the received data symbols; and wherein each of the first parts and the second parts of the received coding symbols includes at most M consecutive bits of the received coding symbols.

7. The integrated circuit of claim 6, wherein each of the first parts of the received data symbols and the first parts of the received coding symbols includes a first number of bits;
  wherein each of the second parts of the received data symbols and the second parts of the received coding symbols includes a second number of bits; and
  wherein the first number and the second number are different.

8. A method, comprising:
  receiving an input message including one or more data symbols, each data symbol having N bits, wherein N is a positive integer;
  performing Reed-Solomon encoding to the one or more data symbols to generate one or more coding symbols, wherein the Reed-Solomon encoding uses a Galois field having an order that is less than $2^N$;
  performing multiplication and division operations on field elements of the Galois field by retrieving pre-computed multiplication values and pre-computed division values from a storage;
  providing, using the storage, a multiplication lookup table including the pre-computed values for the multiplication operations;
  providing, using the storage, a division lookup table including the pre-computed values for the division operations; and
  providing a coded message including the one or more data symbols and the one or more coding symbols,
  wherein the order of the Galois field is equal to $2^M$,
  wherein M is an integer greater than two and less than N,
  wherein each of the multiplication lookup table and the division lookup table has a size less than $M*2^{M*2}$ bits.

9. The method of claim 8, wherein the performing Reed-Solomon encoding based on the Galois field to the one or more data symbols includes:
  performing Reed-Solomon encoding to first parts of the data symbols to generate first parts of the coding symbols;
  performing Reed-Solomon encoding to second parts of the data symbols to generate second parts of the coding symbols; and
  generating the coding symbols by combining at least the first parts of the coding symbols and the second parts of the coding symbols;
  wherein each of the first parts and second parts of the data symbols includes at most M consecutive bits of the N bits of the data symbols.

10. The method of claim 9, wherein the performing Reed-Solomon encoding based on the Galois field to the one or more data symbols includes:
  performing Reed-Solomon encoding to third parts of the data symbols to generate third parts of the coding symbols; and
  generating the coding symbols by combining at least the first parts of the coding symbols, the second parts of the coding symbols, and the third parts of the coding symbols;
  wherein each of the third parts of the data symbols includes at most M consecutive bits of the N bits of the data symbols.

11. The method of claim 8, further comprising:
  receiving a received coded message including received data symbols and received coding symbols, each of the received data symbol and received coding symbols including N bits;
  performing Reed-Solomon decoding based on the Galois field to the received data symbols and received coding symbols to generate decoded data symbols; and
  providing a decoded message including the decoded data symbols.

12. The method of claim 11, wherein the performing Reed-Solomon decoding based on the Galois field to the received data symbols and received coding symbols includes:
  performing multiplication and division operations on field elements of the Galois field by retrieving the pre-computed multiplication and division results from the storage.

13. The method of claim 12, wherein the performing Reed-Solomon decoding based on the Galois field to the received data symbols and received coding symbols includes:
  performing Reed-Solomon decoding on first parts of the received data symbols and first parts of the received coding symbols to generate first parts of the decoded data symbols;
  perform Reed-Solomon decoding to second parts of the received data symbols and second parts of the received coding symbols to generate second parts of the decoded data symbols; and
  generating the decoded data symbols by combining at least the first parts of the decoded data symbols and the second parts of the decoded data symbols;
  wherein each of the first parts and the second parts of the received data symbols includes at most M consecutive bits of the received data symbols; and
  wherein each of the first parts and the second parts of the received coding symbols includes at most M consecutive bits of the received coding symbols.

14. The method of claim 13, wherein each of the first parts of the received data symbols and the first parts of the received coding symbols includes a first number of bits;
  wherein each of the second parts of the received data symbols and the second parts of the received coding symbols includes a second number of bits; and
  wherein the first number and the second number are different.

* * * * *